United States Patent [19]

Woody

[11] Patent Number: 4,955,085
[45] Date of Patent: Sep. 4, 1990

[54] SERIES RF/PARALLEL IF MIXER ARRAY

[75] Inventor: David P. Woody, Bishop, Calif.

[73] Assignee: California Institute of Technology, Pasadena, Calif.

[21] Appl. No.: 164,933

[22] Filed: Mar. 7, 1988

[51] Int. Cl.$^5$ ............................................. H04B 1/26
[52] U.S. Cl. .................................. 455/330; 455/323; 455/325
[58] Field of Search ............... 455/330, 293, 280, 281, 455/291, 323, 325

[56] References Cited

U.S. PATENT DOCUMENTS

| | | | |
|---|---|---|---|
| 4,450,584 | 5/1984 | Saka et al. | 455/325 |
| 4,566,132 | 1/1986 | Meyer et al. | 455/330 X |
| 4,598,424 | 7/1986 | Watanabe et al. | 455/325 X |

FOREIGN PATENT DOCUMENTS 0951722  8/1982  U.S.S.R. ............................... 455/330

OTHER PUBLICATIONS

"SIS Mixer to HEMT Amplifier Optimum Coupling Network"; S. Weinreb, IEEE Transactions on Microwave Theory and Techniques; vol. MTT-35, No. 11, Nov. 1987, pp.1067-1069.
"Large Gain, Negative Resistance and Oscillations in Superconducting Quasiparticle Hetrodyne Mixers;" W. R. McGrath, Applied Physics Letters 39(8); Oct. 15, 1981, pp. 655-658.
"Broad-Band RF Match to a Millimeter-Wave SIS Quasi-Particle Mixer"; W. R. McGrath et al.; IEEE Transactions on Microwave Theory and Techniques, vol. MTT-33, No. 12, Dec. 1985; pp. 1495-1500.
Acta Polytechnica Scandinavica; Electrical Engineering Series, No. 46, 1980; Antt: V. Räisänen: pp. 3-55.
"Negative Resistance and Conversion Gain in SIS Mixers" A. D. Smith et al.; Physica 108B; pp. 1367-1368; 1981.
"Super Conducting Tunnel Detectors In Radio Astronomy"; Thomas G. Phillips et al.; Scientific American, vol. 254, No. 5, May 1986, pp. 96-102.
"Integrated Tuning Elements for SIS Mixers"; A. R. Kerr et al.; 1987 International Superconductivity Electronics Conference.

Primary Examiner—Benedict V. Safourek
Assistant Examiner—Ralph Smith
Attorney, Agent, or Firm—Leonard Tachner

[57] ABSTRACT

An RF/IF mixer array employs serially connected capacitors and parallel connected inductors to increase the net impedance of a plurality of mixers at RF frequencies and to reduce the net impedance of the plurality of mixers at IF frequencies. Although the mixer elements may be virtually any type elements including Schottky diodes, the invention is particularly well suited to be used with SIS tunneling junction mixer elements which typically require such impedance transformation for efficient signal transfer in highly sensitive heterodyne receivers such as those used in radio astronomy.

14 Claims, 2 Drawing Sheets

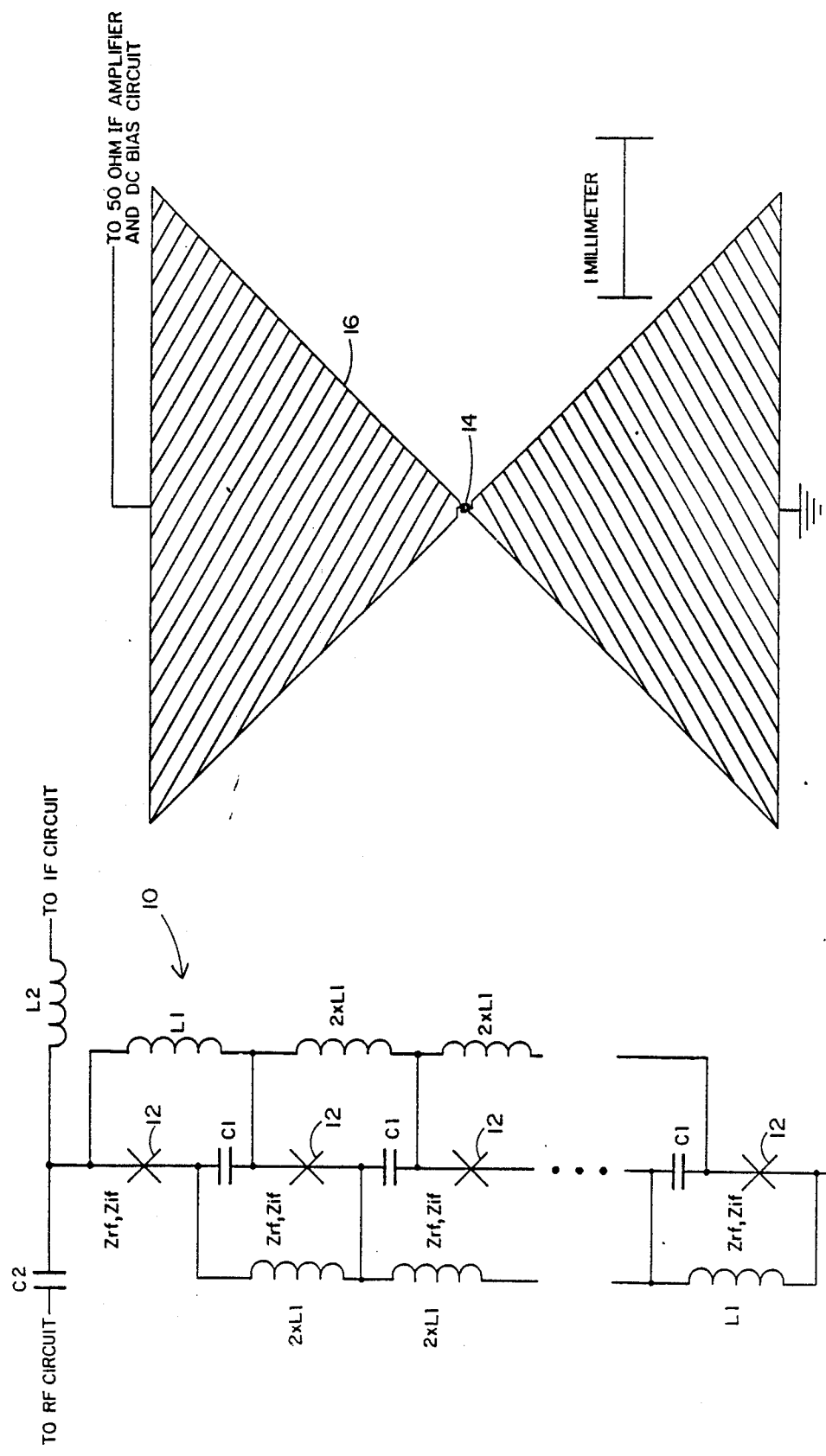

SERIES RF/PARALLEL IF MIXER ARRAY

BACKGROUND OF THE INVENTION

1. Field of the Invention:

The present invention relates generally to impedance matching devices for receivers and more specifically, to a device for presenting the active elements of a mixer with different RF and IF impedances to permit matching an antenna impedance to the optimum RF impedance of the mixer array while simultaneously matching the array's output IF impedance to an IF amplifier circuit.

2. Prior Art:

The impedance matching problem solved by the present invention is especially acute in SIS tunneling junction devices which have a typical IF impedance to RF impedance ratio of 12-1. However, most antenna and waveguide structures have a natural impedance of 100 Ohms or larger while the standard impedance for IF amplifiers is 50 Ohms and the optimum impedance for many low noise transistors is as low as 10 Ohms. The non-linear element in a mixer has its own optimum source (RF) and load (IF) impedance. The problem therefore is to build a network which matches the antenna impedance to the optimum RF impedance of the device and also matches the device's output IF impedance to the IF amplifier circuit. For typical Schottky diodes with a local oscillator signal applied, the optimum RF source and the IF impedance are usually close to each other. In this case, the matching requirements are modest and standard techniques such as quarter-wave transformers are satisfactory for accomplishing the conversion requirement despite their sometimes bulky configuration for use in mixer arrays. Accordingly, while the present invention has application in virtually any impedance matching circuit, the principal advantage resides in its small size and high conversion ratio especially useful in conjunction with SIS tunnel junction devices and it is in conjunction with such devices that the particular embodiment of the invention herein disclosed relates.

The current principal application for receiving devices which utilizes SIS tunnel junction devices is in the radio astronomy art. SIS tunnel junction devices have a very high sensitivity and operate extremely well in the millimeter and sub-millimeter wavelength ranges of radio astronomy. In addition, SIS tunnel junction devices are extremely small making them physically compatible with the millimeter and sub-millimeter wavelengths of radio astronomy. An article describing the use of the SIS tunnel junction devices in radio astronomy and which includes a detailed description of the tunnel junction device itself, is entitled "Super Conducting Tunnel Detectors In Radio Astronomy" by Thomas G. Phillips and David B. Rutledge published in Scientific American in the May 1986 edition (Volume 254, No. 5) at pages 96–102. Other references of some relevance to the present invention include; An article entitled "Negative Resistance and Conversion Gain In SIS Mixers" by A. D. Smith, et al published in Physica 108B, pages 1367–1368 (1981) by North-Holland Publishing Company. An article entitled "Large Gain, Negative Resistance and Oscillations In Superconducting Quasiparticle Hetrodyne Mixers" by W. R. McGrath et al from Applied Physics Letters 39(8), 15 Oct. 1981, pages 655–658; an article entitled "Broad-Band RF Match To a Millimeter-Wave SIS Quasi-Particle Mixer" by W. R. McGrath et al, IEEE Transactions On Microwave Theory and Techniques, Volume MTT-33, No. 12, Dec. 1985, pages 1495–1500; an article entitled "Integrated Tuning Elements For SIS Mixers" by A. R. Kerr et al, published at the 1987 International Superconductivity Electronics Conference; an article entitled "SIS Mixer to HEMT Amplifier Optimum Coupling Network" by S. Weinreb, published in the IEEE Transactions On Microwave Theory and Techniques, Volume MTT-35, No. 11, Nov. 1987, pages 1067–1069; and an article entitled "Noise Parameters of SIS Mixers" by L. Addario, submitted to the IEEE Transactions On Microwave Theory and Techniques dated Sep. 23, 1987. The applicant herein knows of no prior art impedance matching devices which may be packaged in as small a space as the present invention nor which are capable of matching impedances having such a high ratio with respect to each other.

SUMMARY OF THE INVENTION

The present invention comprises an RF/IF array mixer circuit that permits impedance transformation between RF and IF frequencies in hetrodyne receivers. Although the circuit of the present invention may be used in virtually any such receiver at virtually any frequency, it finds especially advantageous application at millimeter and submillimeter wavelengths such as those used in radio astronomy. In that particular application the array of the present invention is used in conjunction with superconducting-insulator-superconducting tunnel junction mixers which are the lowest noise mixers in the millimeter wavelength range, but which have a large ratio of IF to RF impedances. The circuit of the present invention utilizes a plurality of cells each of which provides an interconnection of capacitors and inductors in association with a plurality of active mixing elements so that mixing elements are connected in series at the RF frequency and connected in parallel at the IF frequency. Consequently, the RF impedance of the mixing elements is equal to the impedance of each element at the RF frequency multiplied by the number of such cells and the impedance of the IF frequency is equal to the IF impedance of each mixing element divided by the number of cells. This results in an effective increase in the RF impedance and an equivalent decrease in the IF impedance both by the same factor equal to the number of mixing elements in the array.

OBJECTS OF THE INVENTION

It is therefore a principal object of the present invention to provide an RF/IF mixer array circuit which simultaneously matches a non-linear mixing element to a high impedance RF antenna structure and to a lower impedance IF amplifier over a broad bandwidth.

It is an additional object of the present invention to provide an RF/IF mixer array circuit capable of matching a heterodyne mixer element to both a high impedance RF antenna and to a lower impedance IF amplifier while being configured in an area much smaller than a wavelength thereby making it suitable for use in planar arrays of mixers for imaging and phased array radar.

It is still an additional object of the present invention to provide an RF/IF mixer array circuit which effectively connects a plurality of non-linear mixer devices in series at the RF frequency and simultaneously connects them in parallel at the IF frequency to effectively transform the impedance of a single device up by a factor equal to the number of devices in series to match the RF antenna impedance and at the same time transform the devices' IF impedance down by the same factor to match the impedance of the IF amplifier.

It is still an additional object of the present invention to provide an RF/IF mixer array circuit that is especially advantageous for use with superconducting-insulator-superconducting (SIS) tunnel junction mixers in highly sensitive receivers such as for operation in radio telescopes at millimeter and sub-millimeter wavelength frequencies.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the accompanying drawings in which:

FIG. 1 is a conceptual schematic illustration of the equivalent circuit of the present invention;

FIG. 2 is a schematic illustration of a bow tie antenna having a Series RF-Parallel IF array of four SIS tunnel junctions at the apex thereof for illustrating a typical application of the invention.

DETAILED DESCRIPTION OF THE PREFERRED EMBODIMENT

Figure 3:
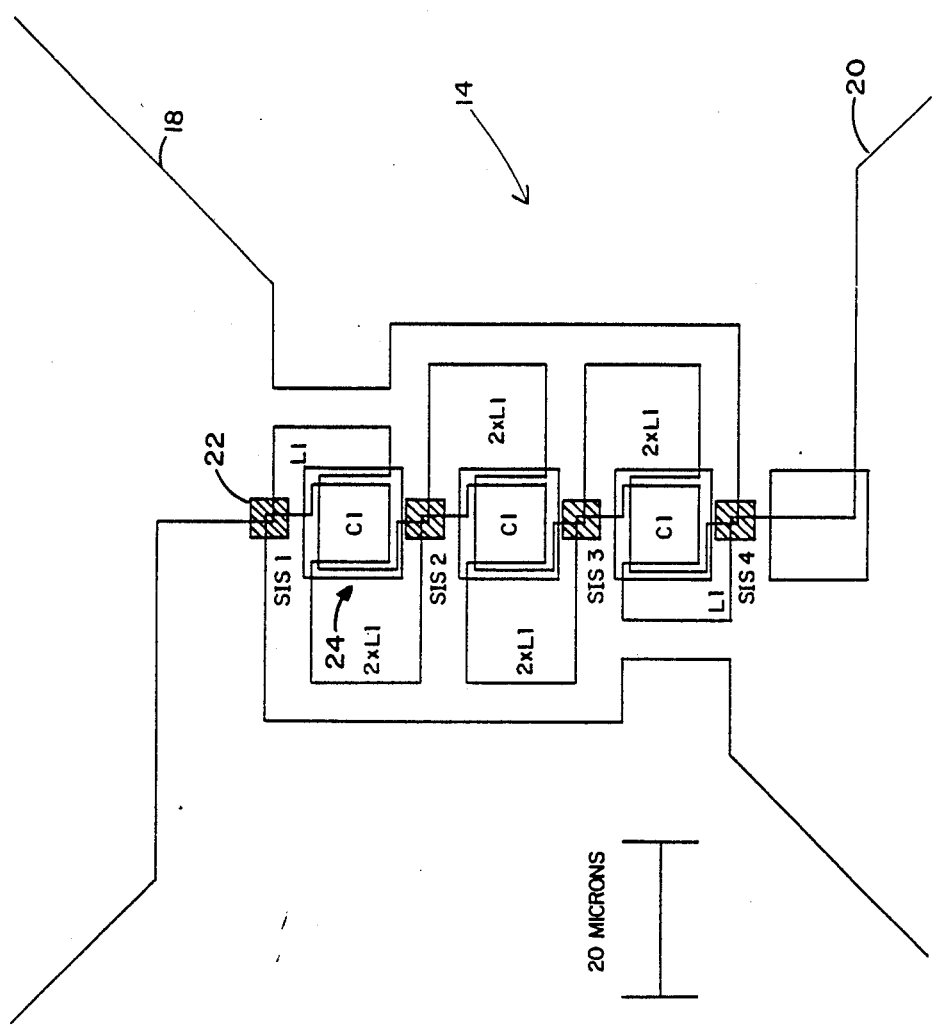
FIG. 3 is a greatly enlarged view of the tunnel junction array of FIG. 2 illustrating actual embodiment of the invention for use at a frequency compatible with radio telescope applications.

Referring first to FIG. 1, it will be seen that the equivalent circuit of the RF/IF mixer array 10 of the present invention comprises a plurality of active mixing elements 12, a plurality of inductors L1 and a plurality of capacitors C1. Mixing elements 12 have an Zrf impedance at the frequency Frf and an impedance Zif at frequency Fif. The inductors L1 are chosen to block the Frf frequency and pass the Fif frequency. Thus, the RF impedance of L1 is much greater than Zrf and the IF impedance of L1 is much less than Zif. The capacitors C1 are chosen to pass Frf and block Fif. Thus, the RF impedance of C1 is much less than Zrf and the IF impedance of C1 is much greater than Zif. L1 and C1 can also be selected to tune out the parasitic reactances of the mixing element 12 as long as L1 and C1 have values consistent with the blocking and passing requirements at the RF and IF frequencies.

The net impedance that the RF/IF mixer array 10 of the present invention presents to an external RF circuit is approximately N×Zrf where N is the number of active mixing elements. The net impedance that the array 10 of the present invention presents to the external IF circuit is approximately Zif divided by N. Those having skill in the art to which the present invention pertains will therefore observe that to the RF frequency signal from the RF circuit, the impedance seen looking at the mixer array 10 of the invention comprises a series interconnection of mixers with substantially little or no impedance between them as C1 has been chosen to pass the RF frequency and very large impedance in paraillel with each mixing element 12 because L1 has been selected to block the RF frequency. Thus, the equivalent net impedance to the RF circuit looking into the array 10 is merely the impedance of each mixing element multiplied by the number of mixing elements in the array connected in series.

On the other hand, looking at the array 10 of the present invention from the IF circuit at a much lower IF frequency, each one of the capacitors C1 will appear as virtually an open circuit because the capacitors C1 are chosen to block the IF frequency. Because the conductors 11 are chosen to pass the IF frequency, each of the inductors L1 will appear as virtually a short circuit at the IF frequency. It will be seen that because of the interconnection between the inductors L1 and the mixing elements and taking into consideration the equivalent open circuits provided by the capacitor C1, each of the mixing elements will be in parallel with the others. Consequently, the IF impedance, that is, the impedance looking towards the array from the IF circuit at an IF frequency, will be the equivalent of a parallel array of active mixing elements 12 thus providing a net impedance which is equal to the impedance Zif, that is the IF impedance of the active mixing element, divided by the number of elements in the array connected in that parallel configuration.

It will be observed that at one frequency, namely, the RF frequency, the circuit array of the present invention produces an equivalent series interconnection of mixing elements and at an IF frequency, the same circuit produces an equivalent parallel interconnection of mixing elements. The circuit of the present invention may also optionally include an IF blocking capacitor C2 in the RF circuit and an RF blocking conductor L2 in the IF circuit.

Reference will now be made to FIGS. 2 and 3 which illustrate a selected embodiment of the invention suitable for operation in a radio astronomy application. FIG. 2 illustrates the use of bowtie antenna 16 for collecting radiation at a selected frequency. The bowtie antenna is coupled to radiation incident normal to the plane of the bowtie. A SIS four tunnel junction mixer array 14 is positioned at the apex of the bowtie antenna 16 for impedance matching purposes in the manner hereinafter described. In this particular application, fabrication of the present invention is accomplished using planar thin film technology commonly used at microwave and higher frequencies. However, the present invention is not to be deemed limited to such fabrication techniques and is in fact also well suited for devices operating at lower frequencies. The general rule is that the more devices used, the larger the impedance transformation. For Schottky diodes where the impedance requirements are modest, only two or three Schottky diodes would normally be required to accomplish impedance matching. However, for SIS tunnel junctions operating at high gain, four to ten SIS junctions may be required. In the bowtie antenna application of FIG. 2, four SIS junctions are coupled to a broadband bowtie antenna on a dielectric hemisphere. The bowtie is coupled to radiation incident normal to the plane of the bowtie from the dielectric. This antenna has a driving point impedance at its bandwidth center of 120 Ohms. The IF output signal and DC bias are carried out at the ends of the bowtie to an IF amplifier and biasing circuit (not shown). The normal state resistance of a single SIS junction is 60 Ohms. Furthermore, a single SIS junction has an optimum RF impedance of about 30 Ohms and an IF output impedance of about 200 Ohms. By using the circuit of the present invention in the manner hereinafter described, the array employing four SIS junctions yields an RF impedance of 120 Ohms to match the bowtie impedance and an IF impedance of 50 Ohms to match the input impedance of the IF amplifier.

Referring now to FIG. 3 it will be seen that the structure of the array 14 of FIG. 2 can be fabricated using two patterned superconducting films. A bottom layer 18 and a top layer 20 are separated by two different insulating dielectrics, namely, a very thin dielectric layer 22 to form the tunneling barrier for the SIS junction and a much thicker dielectric layer 24 for the insulator between the plates of the capacitors C1. The schematic details shown in FIG. 3 correspond to an RF frequency of about 300 GHz. and an IF frequency of about 1 GHz. The capacitors C1 couple the RF signals between the SIS junctions while isolating the IF signals. A value of 0.26 picoFarads accomplishes this quite satisfactorily. At 300 GHz. the impedance of C1 is only $-j2.1$ Ohms while at 1 GHz. the impedance of C1 is $-j650$ Ohms. This capacitor can be fabricated by using an insulating dielectric 24 such as silicon oxide several hundred angstroms thick and about $10 \times 10$ microns square between the two superconducting films 18 and 20.

The inductances required are very small and can be formed using a single loop of conductor. The inductors L1 and 2L1 serve two purposes in this particular circuit. They couple the IF signals between the junctions and in addition, they resonate out the parasitic capacitance of the SIS junctions. A typical SIS junction is about 1 micron $\times$ 1 micron square sandwich consisting of two superconducting films separated by a very thin (about 10 angstroms) insulating barrier 22 through which the carriers can quantum mechanically tunnel. This structure has a parasitic capacitance of about 0.03 picoFarads. By choosing L1 equal to 8.4 picoHenrys the net reactive shunting conductance in paralllel with the individual junctions at 300 GHz. is nearly zero but at 1 GHz. the inductors are essentially a short so that the IF signals are effectively coupled together in parallel. Note that the top and bottom-most SIS junctions, that is, SIS1 and SIS4 are shunted by only one inductor L1 while the middle SIS junctions, that is, SIS2 and SIS3 are shunted by two inductors one on each side of the structure. That is why the middle inductors are valued at 2L1.

Thus, comparing the embodiment of FIG. 3 with the schematic diagram of FIG. 1 it will be seen that the specific implementation shown in FIG. 3 utilizes four cells where N of FIG. 1 is equal to four. Consequently, because the RF impedance for a single junction is about 30 Ohms., the impedance for this series array of four junctions will be about 120 Ohms. which precisely matches the driving point impedance of the bowtie antenna of FIG. 2 at the center of its bandwidth. On the other hand, the output impedance for a single junction at IF is about 200 Ohms and therefore the IF impedance for the array of parallel interconnected four junctions is about 50 Ohms which matches the impedance of most IF amplifier operating at these frequencies.

One of the significant advantages of the present invention, particularly at the frequencies referred to in conjunction with the example of FIG. 3, is that even when using a substantially larger number of junctions for an array of 10 cells, the total linear dimension of the array is on the order of 200 microns, a size which makes the array virtually invisible even in the bowtie antenna of FIG. 2 which has maximum linear dimensions on the order of 5 millimeters. Of course, using the array at lower frequencies, for example, in conjunction with Schottky diode mixers, would require more spacial area than that shown in FIG. 3. However, given the relative simplicity of the schematic circuit of the present invention, its chief advantage over other matching circuits is compactness at virtually any frequency.

It will now be understood that what has been disclosed herein comprises an RF/IF array mixer circuit that permits impedance transformation between RF and IF frequencies in hetrodyne receivers. Although the circuit of the present invention may be used in virtually any such receiver at virtually any frequency, it finds especially advantageous application at millimeter and submillimeter wavelengths such as those used in radio astronomy. In that particular application the array of the present invention is used in conjunction with superconducting-insulator-superconducting tunnel junction mixers which are the lowest noise mixers in the millimeter wavelength range, but which have a large ratio of IF to RF impedances. The circuit of the present invention utilizes a plurality of cells each of which provides an interconnection of capacitors and inductors in association with a plurality of active mixing elements so that mixing elements are connected in series at the RF frequency and connected in parallel at the IF frequency. Consequently, the RF impedance of the mixing elements is equal to the impedance of each element at the RF frequency multiplied by the number of such cells and the impedance of the IF frequency is equal to the IF impedance of each mixing element divided by the number of cells. This results in an effective increase in the RF impedance and an equivalent decrease in the IF impedance both by the same factor equal to the number of mixing elements in the array.

Those having skill in the art to which the present invention pertains will, as a result of the applicant's teaching herein, now perceive various modifications and additions which may be made to the invention. By way of example, minor circuit alterations and substantial changes in frequency and values of circuit devices such as capacitors and inductors used to accommodate such different frequencies, will now be evident as a result of the teaching herein disclosed. Accordingly, all such modifications and additions are deemed to be within the scope of the invention which is to be limited only by the claims appended hereto.

I claim:

1. A mixer circuit for use in a heterodyne receiver for converting a radio frequency (RF) signal to an intermediate frequency (IF) signal, the circuit having a plurality of mixing elements each having an impedance Zif which is higher at the IF frequency than its impedance Zrf is at the RF frequency; the circuit comprising;
   a series interconnection of said elements;
   a plurality of capacitors connected in said series interconnection, at least one such capacitor connected serially between each pair of said elements;
   a plurality of inductors, at least one such inductor connected in parallel with each combination of element and adjacent capacitor;
   said capacitors being selected to substantially block signals at the IF frequency and pass signals at the RF frequency and said inductors being selected to substantially block signals at the RF frequency and pass signals at the IF frequency, whereby said elements are connected in series at the RF frequency and are connected in parallel at the IF frequency and the net impedance of the circuit at said IF frequency is Zif divided by the number of said mixing elements and the net impedance of the circuit at said RF frequency is Zrf multiplied by the number of said mixing elements.

2. The circuit recited in claim 1 wherein each of said mixing elements is a superconducting-insulator-superconducting (SIS) tunnel junction mixer.

3. The circuit recited in claim 2 wherein said mixing elements, said capacitors and said inductors are provided in a common area having linear dimensions smaller than the wavelength of said RF frequency.

4. The circuit recited in claim 2 wherein each of said mixing elements and adjacent capacitor combinations comprises two patterned superconducting films separated by two insulating dielectric material layers, one such layer forming the tunneling barrier for the mixing element and the other such layer forming the insulator for the capacitor.

5. The circuit recited in claim 1 wherein the net impedance of the circuit at the IF frequency is about 50 Ohms.

6. The circuit recited in claim 1 wherein said mixing elements are Schottky diodes.

7. An RF to IF mixer and impedance matching circuit comprising:
   a plurality of mixing elements;
   a plurality of capacitors, said elements and said capacitors being connected in series with at least one such capacitor being connected between each pair of adjacent elements; and
   a plurality of inductors, at least one such inductor being connected in parallel with each combination of element and adjacent capacitor;
   said capacitors and inductors being selected to connect said elements in series at the RF frequency and to connect said elements in parallel at the IF frequency.

8. The circuit recited in claim 7 wherein each of said mixing elements is a superconducting-insulator-superconducting (SIS) tunnel junction mixer.

9. The circuit recited in claim 8 wherein said mixing elements, said capacitors and said inductors are provided in a common area having linear dimensions smaller than the wavelengths of said RF frequency.

10. The circuit recited in claim 8 wherein each of said mixing elements and adjacent capacitor combinations comprises two patterned superconducting films separated by two insulating dielectric material layers, one such layer forming the tunneling barrier for the mixing element and the other such layer forming the insulator for the capacitor.

11. The circuit recited in claim 7 wherein the net impedance of the circuit at the IF frequency is about 50 Ohms.

12. The circuit recited in claim 7 wherein said mixing elements are Schottky diodes.

13. An impedance matching circuit having an input for receiving an input signal at a first signal frequency and an output for transmitting an output signal at a second signal frequency; the circuit comprising;
   a plurality of elements the net combined impedance of which is to be altered at different frequencies;
   a plurality of first reactances each having a first signal frequency dependent impedance characteristic, said elements and said first reactances being connected in series wherein one such first reactance is connected between each pair of adjacent elements; and
   plurality of second reactances each having a second signal frequency dependent impedance characteristic, each such second reactance being connected in parallel with a single combination of element and adjacent first reactance;
   said first and second reactances being selected so that said elements are effectively connected in series at frequencies equal to and greater than said first signal frequency and are effectively connected in parallel at frequencies equal to and less than said second signal frequency.

14. The impedance matching circuit recited in claim 13 wherein said elements are mixing elements, said first reactances are capacitors, said second reactances are inductors, said first signal frequency is an RF frequency and said second signal frequency is an IF frequency.

* * * * *